US006373417B1

(12) United States Patent
Melanson

(10) Patent No.: US 6,373,417 B1
(45) Date of Patent: Apr. 16, 2002

(54) DIGITAL TO ANALOG CONVERTER USING LEVEL AND TIMING CONTROL SIGNALS TO CANCEL NOISE

(75) Inventor: John Laurence Melanson, Boulder, CO (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/510,818

(22) Filed: Feb. 23, 2000

Related U.S. Application Data
(60) Provisional application No. 60/121,207, filed on Feb. 23, 1999.

(51) Int. Cl.[7] .................................................. H03M 3/00
(52) U.S. Cl. ......................... 341/143; 341/144; 341/155
(58) Field of Search ................................. 341/143, 155, 341/144, 118, 1.12

(56) References Cited

U.S. PATENT DOCUMENTS

| | | | |
|---|---|---|---|
| 5,027,119 A | * 6/1991 | Toyomaki et al. | ........... 341/144 |
| 5,068,661 A | * 11/1991 | Kaneaki et al. | ............. 341/143 |
| 5,124,703 A | * 6/1992 | Kaneaki et al. | ................ 341/77 |
| 5,548,286 A | 8/1996 | Craven | ........................ 341/126 |
| 5,559,467 A | 9/1996 | Smedley | ...................... 330/10 |
| 5,708,433 A | 1/1998 | Craven | ........................ 341/144 |
| 5,784,017 A | 7/1998 | Craven | ........................ 341/126 |
| 5,815,102 A | 9/1998 | Melanson | .................... 341/143 |

OTHER PUBLICATIONS

Hawksford, M.O.J. "Dynamic Model–Based Linearization of Quantized Pulse–Width Modulation for Applications in Digital–to–Analog Conversion and Digital Power Amplifier Systems," J. Audio Eng. Soc., vol. 40, No. 4, Apr. 1992, pp. 235–252.

Craven, Peter. "Toward the 24–bit DAC: Novel NoiseShaping Topologies Incorporating Correction for the Nonlinearity in a PWM Output Stage," J. Audio Eng. Soc., vol. 41, No. 5, May 1993, pp. 291–313.

Matsuya, Yasuyuli, Kunihara Uchimura, Atsushi Iwata, and Takao Kaneko. "A 17–bit Oversampling D–to–A Conversion Technology Using Multistage Noise Shaping," IEEE Journal of Solid–State Circuits, vol. 24, No. 4, Aug. 1989, pp. 969–975.

Matsya, Yusuyuki, Kuniharu Uchimura, Atsushi Iwata, Tsutomu Kobayashi, Masayuki Ishikawa, and Takeshi Yoshitome. "A 16–bit Oversampling A–to–D Conversion Technology Using Triple–Integration Noise Shaping," IEEE Journal of Solid–State Circuits, vol. SC–22, No. 6, Dec. 1987, pp. 921–929.

Candy, James C., and An–ni Huynh. "Double Interpolation for Digital–to–Analog Conversion," IEEE Transactions on Communications, vol. COM–34, No. 1, Jan. 1986, pp. 77–81.

Carley, Richard L., Richard Schreier, and Gabor C. Temes, "Delta–Sigma ADCs with Multibit Internal Converters." *Delta–Sigma Data Converters: Theory, Design, and Simulation*, Ed. Steven R. Norsworthy, Richard Schreier, and Gabor C. Temes, New York: The Institute of Electrical and Electronics Engineers, Inc. pp. 244–281.

\* cited by examiner

*Primary Examiner*—Peguy JeanPierre
(74) *Attorney, Agent, or Firm*—Macheledt, Bales & Johnson; Dan S. Shifrin

(57) ABSTRACT

A multiple stage delta sigma converter includes a first delta sigma modulator providing a first modulator output signal, a second delta sigma modulator providing a second output signal, and a pulse wave modulator for generating formatted output wherein the level (width) of the formatted output is dependent upon the first modulator output and the timing (delay) of the formatted output is dependent upon the second modulator output. The second modulator output is also based upon the first modulator feedback signal. The second modulator quantizer output and feedback signal are constrained by an output of the first converter. A 1 bit digital to analog converter connected to the output of the PWM converts the formatted output signal to an analog signal.

21 Claims, 12 Drawing Sheets

DIGITAL TO ANALOG CONVERTER USING LEVEL AND TIMING CONTROL SIGNALS TO CANCEL NOISE

This application claims the benefit of U.S. Provisional Application No. 60/121,207, filed Feb. 23, 1999.

BACKGROUND OF THE INVENTION

1. Field of the Invention

The present invention relates to apparatus and methods for canceling noise in digital to analog converters using level and timing control signals generated by delta sigma modulators.

2. Description of the Prior Art

In digital to analog conversion, it has become typical for delta sigma (or noise shaped) conversion to be used. For a good discussion of the art, see "Delta-Sigma Data Converters" by Norsworthy et al. In prior art, pulse width modulation and delta sigma noise shaping have been advantageously combined. For example, refer to U.S. Pat. No. 5,815,102 by the present inventor, incorporated herein by reference. FIG. 1 (prior art) shows an oversampling digital to analog converter (DAC), which utilizes a delta sigma converter 114 and a pulse wave modulator (PWM) 116 as the demodulator 112. The interpolation blocks 104, 106, 108 and 110 raise the data rate of the input signal 102. This reduces the quantization noise introduced by the demodulator. Filter 120 outputs an analog signal. U.S. Pat. Nos. 5,548,286 5,784,017 and 5,708,433 show work by Craven to compensate for the effects by modifying the value of feedback for prior and later samples. This can lead to a good cancellation of the distortion.

FIG. 2 (prior art) shows a second order delta sigma converter which includes correction of one of the feedback paths, for example to correct for distortion introduced in the output data. Input 202, is added to feedback signal 218 by adder 204. The signal from adder 204 is fed into first accumulator comprising delay 208 and adder 206. Adder 210 subtracts feedback 218 and the signal from correction block 220 from the output of the first accumulator and feeds the result into the second accumulator, comprising delay 214 and adder 212. The output of the second accumulator goes into quantizer 216. Quantized output 222 also feeds back as feedback signal 218.

Correction block 220 is shown as a black box which has feedback signal 218 as an input and provides a correction signal. For example, correction block 220 uses signal 218 to lookup a correction factor in ROM and supplies it to adder 210 to be added to feedback signal 218 (both are subtracted from the result of the first accumulator). Equivalently, correction block 220 could have as its output a signal comprising feedback signal 218 added to the correction factor. Then, feedback signal would not itself be an input to adder 210.

FIG. 3 (prior art) is a block diagram showing demodulator 112 in more detail. High resolution data 302, for example 12 to 20 bit data, enters delta sigma converter 114. The sample rate of this data has already been increased from the low rate clock required to code the data, to a medium rate clock used to clock the delta sigma converter. The ratio of the low to the medium clock will typically be a factor of 32 to 1024, for example a low clock of 16 kHz to a medium clock of 1 MHz. Delta sigma modulator 114 is clocked by medium clock 313, for example at 1 MHz, to generate medium resolution data 306 (2 to 5 bit for example). PWM duty cycle demodulator 116 is clocked by medium clock 313 and high clock 312.

The frequency of the high clock is a multiple of the medium clock, for example 16 MHz. The output of duty cycle demodulator 116 is low resolution data 310, typically in one or two bit format, at the high clock rate. The optional 0.5 medium clock 314 is used for alternating output data formats. When two different output formats are used in alternating fashion, the 0.5 medium clock rate selects one of the formats for every other data frame output.

A need remains in the art to better cancel noise in digital to analog converters.

SUMMARY OF THE INVENTION

It is an object of the present invention to provide apparatus and methods for canceling noise in digital to analog converters using level and timing control signals generated by delta sigma modulators.

A multiple stage delta sigma converter includes a first delta sigma modulator providing a first modulator output signal, a second delta sigma modulator providing a second output signal, and a format converting block such as a pulse wave modulator for generating a formatted output signal. The level (or width) of the formatted output is dependent upon the first modulator output and the timing (or delay) of the formatted output is dependent upon the second modulator output. The second modulator output is preferably also based upon the first modulator feedback signal. The second modulator quantizer output and feedback signal may be constrained by an output of the first converter. A 1 bit digital to analog converter connected to the output of the PWM converts the formatted output signal to an analog signal.

A delay element may be included between the first modulator and the converter output generating means, and the second modulator output and the second modulator feedback signal constrained by an output of the delay element.

A connecting filter may be included between the first modulator and the second modulator, having as inputs the converter input signal and the first modulator feedback signal, and providing as its output the second modulator input signal.

The connecting filter may comprise a PWM for converting the format of the first modulator feedback signal, step up means for stepping up the frequency of the converter input signal, an adder for combining the output of the PWM and the step up means, an integrator for integrating the output of the adder, a low pass filter for filtering the output of the integrator, and step down means for stepping down the frequency of the output of the low pass filter to form the second modulator input signal.

Alternatively, the connecting filter may comprise a plurality of delays, a plurality of lookup tables, each connected to an input or an output of a lookup table, an adder for combining the outputs of the lookup tables, and an integrator for integrating the output of the adder to form the second converter input signal.

DETAILED DESCRIPTION OF THE PREFERRED EMBODIMENT

Figure 1:
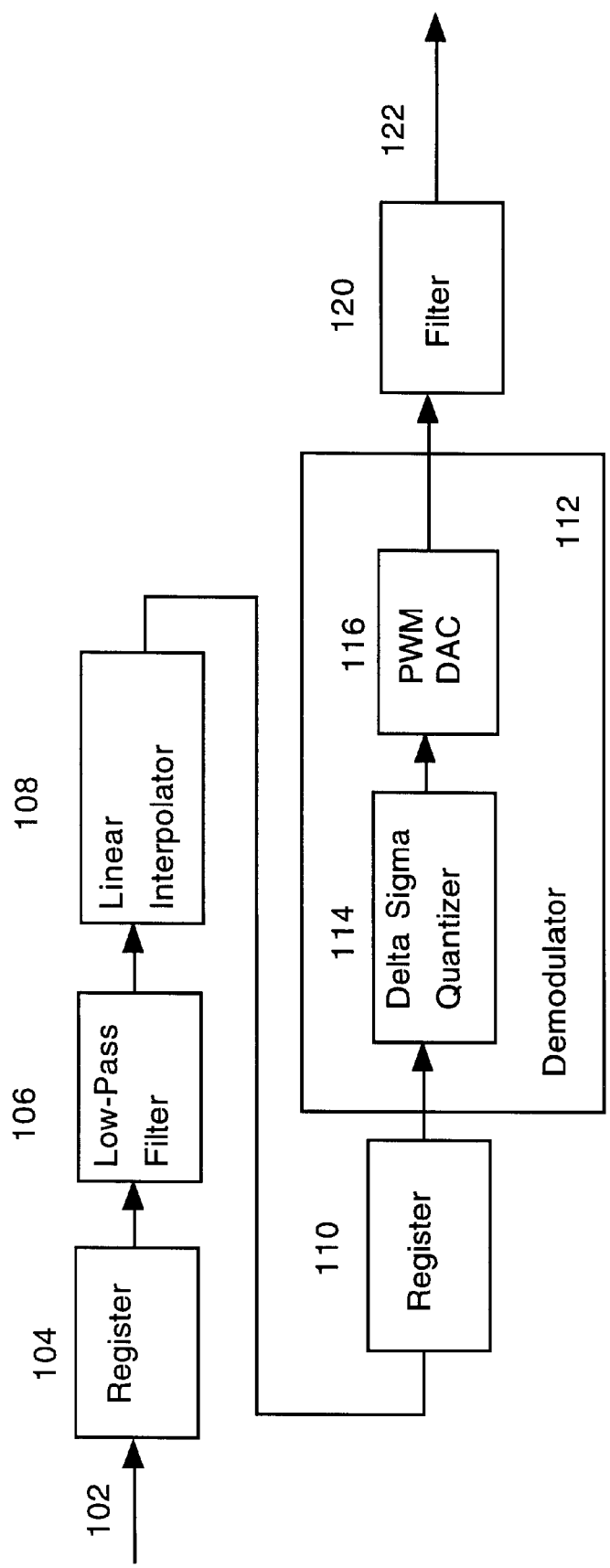
FIG. 1 (prior art) is a block diagram showing a conventional digital to analog converter, including a demodulator comprising a delta sigma converter and a PWM modulator.
Figure 4:
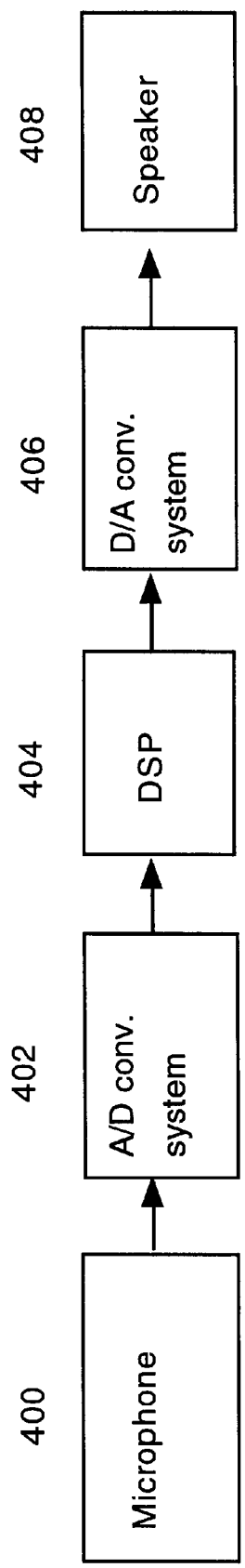
FIG. 4 is a block diagram showing a hearing aid utilizing digital to analog conversion systems according to the present invention.

FIG. 4 shows a hearing aid, as one example of a use for a DAC such as that shown in FIG. 1. The hearing aid comprises a microphone 400, an A/D conversion system 402, digital signal processing (DSP) 404, a digital to analog conversion system (DAC) 406, and a speaker 408. The components of the hearing aid of FIG. 4 are conventional and well understood, except that DAC system 406 is modified in accordance with the present invention. In the preferred embodiment, DAC 406 is a MASH delta sigma converter combined with a PWM or the equivalent, as shown in FIGS. 6, 7, 9, and 10.

Figure 2:
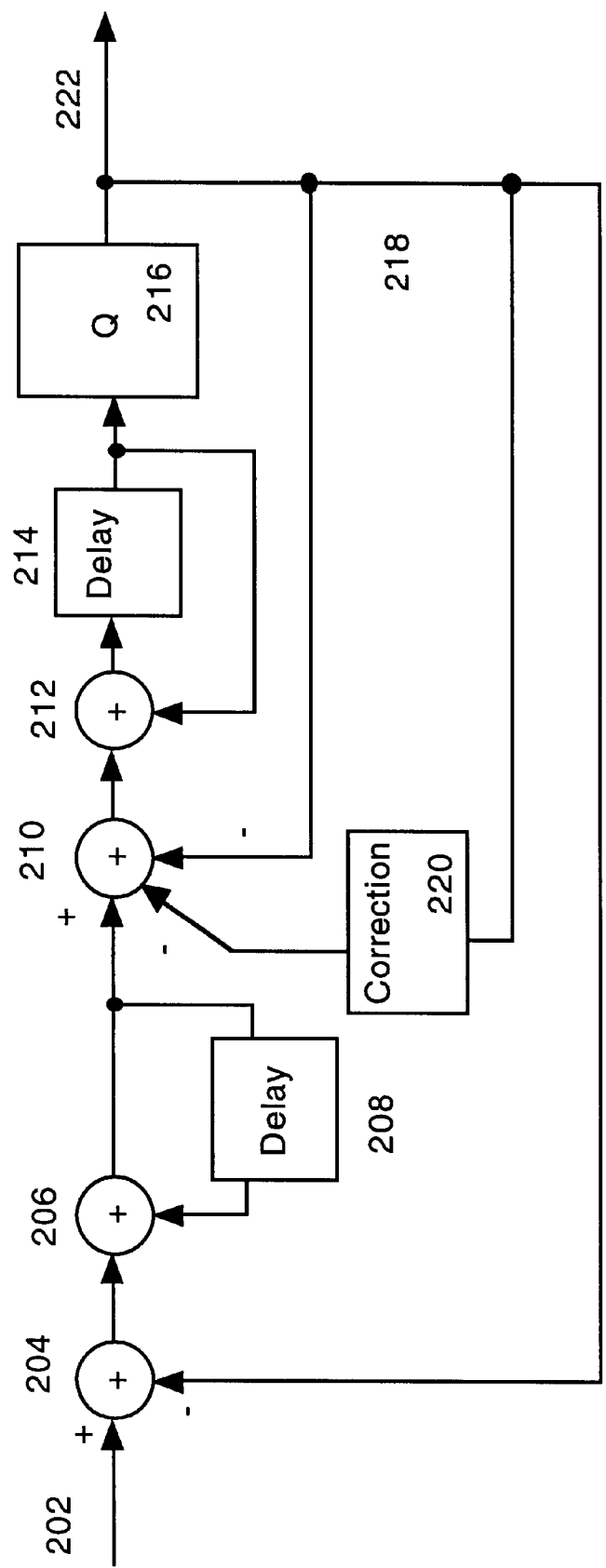
FIG. 2 (prior art) is a block diagram showing an example of the delta sigma converter of FIG. 1, comprising a second order delta sigma converter having one feedback path compensated.
Figure 3:
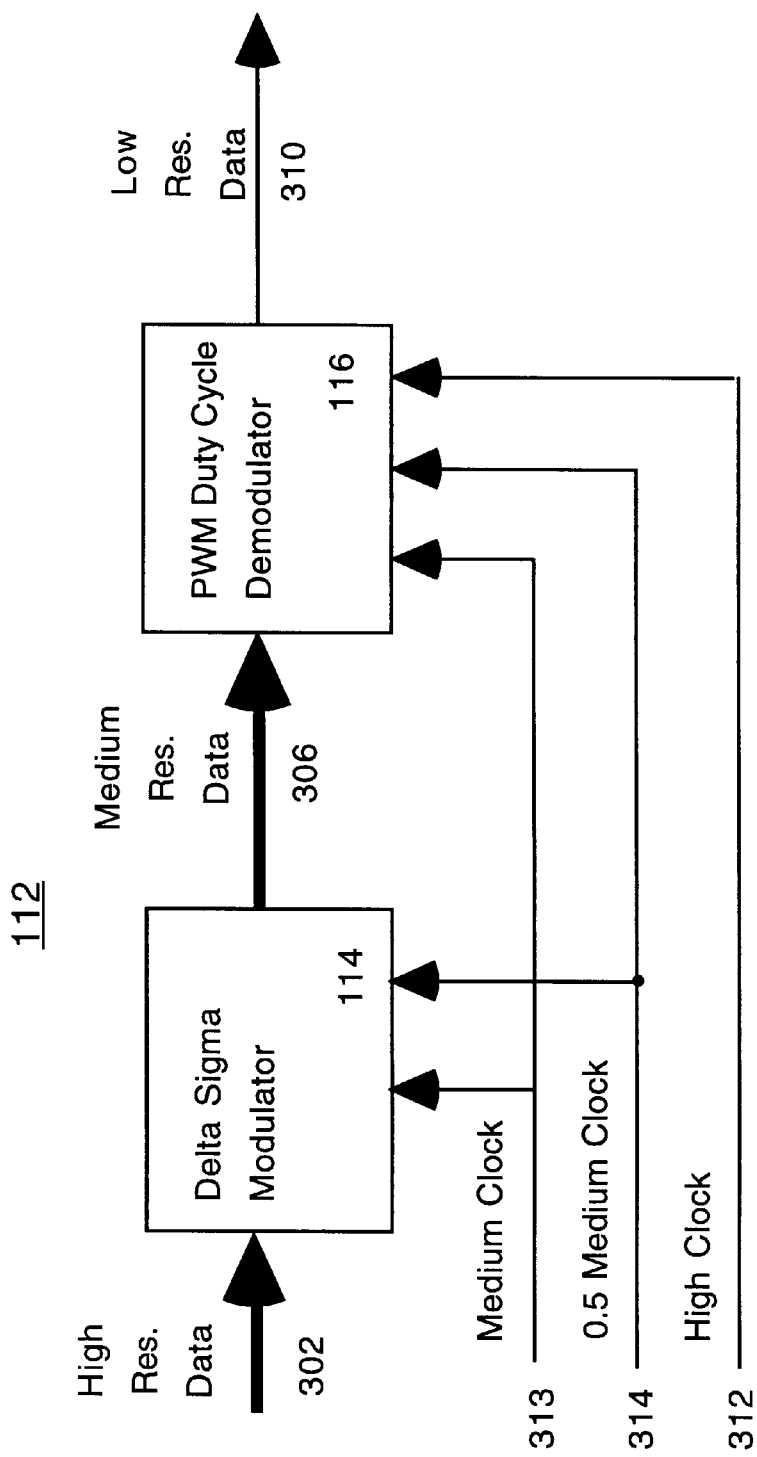
FIG. 3 (prior art) is a block diagram showing the demodulator of FIG. 1 in more detail.
Figure 7:
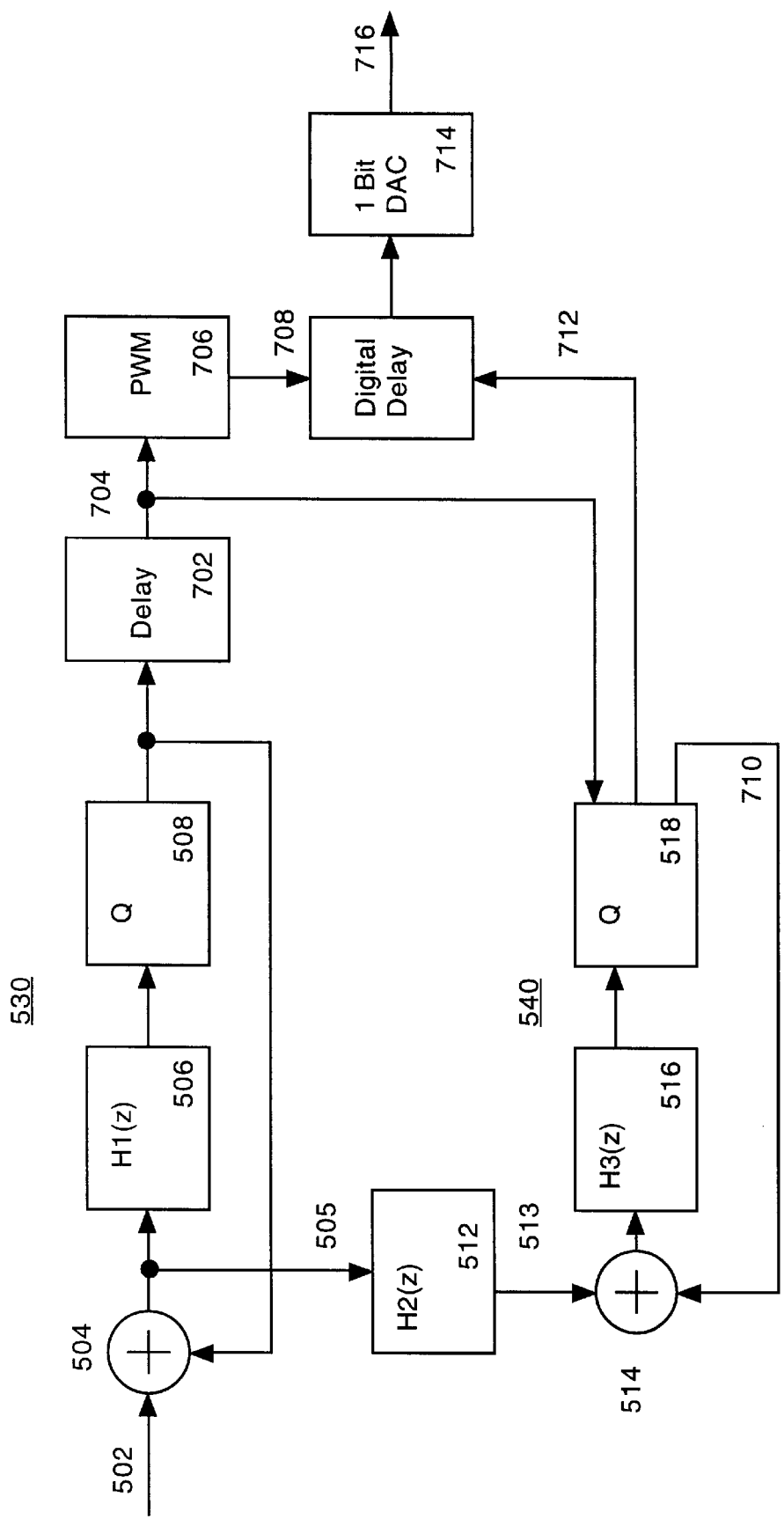
FIG. 7 is a block diagram showing a first embodiment of a MASH circuit like that of FIG. 5 modified according to the present invention to cancel noise.
Figure 9:
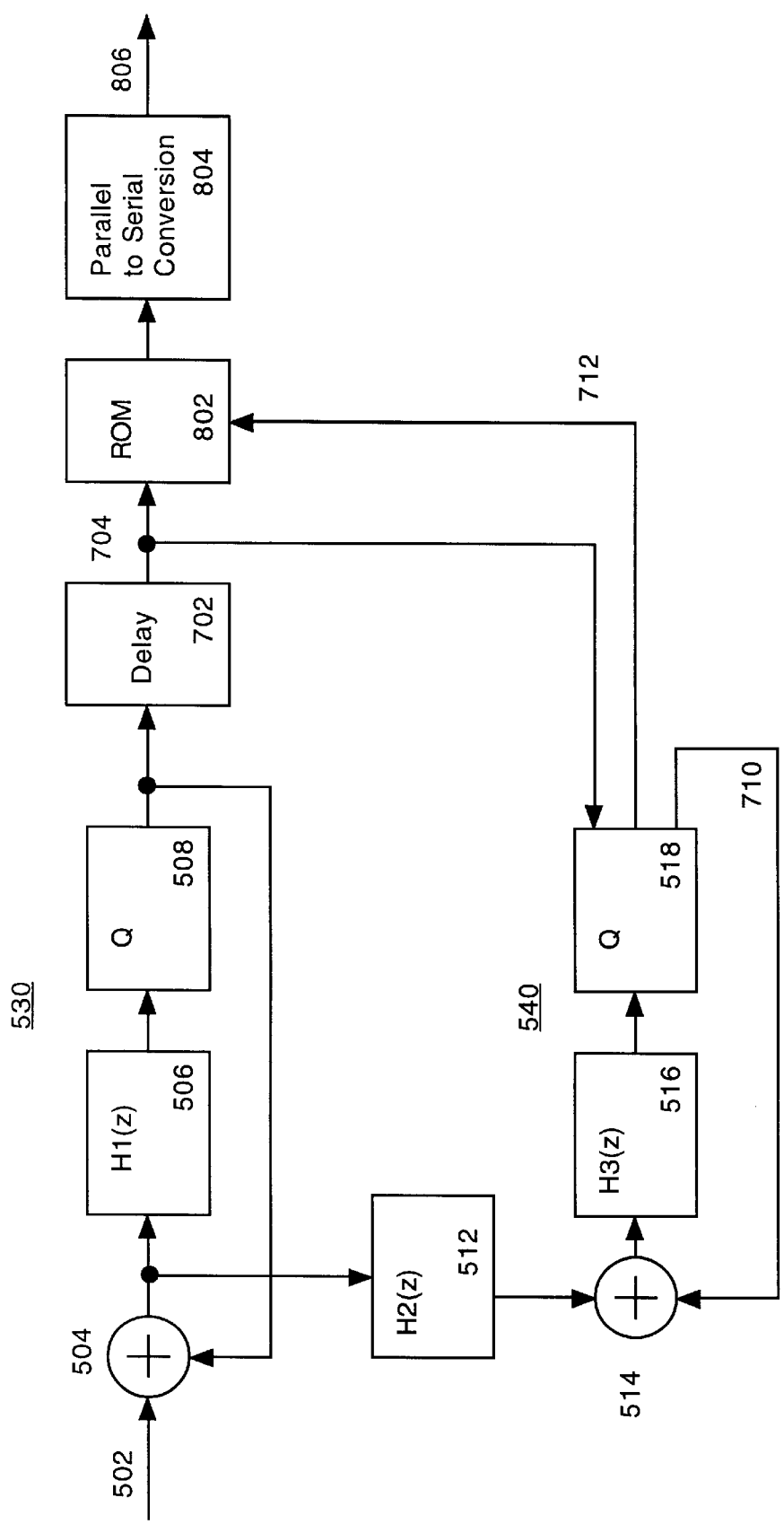
FIG. 9 is a block diagram showing a second embodiment of a MASH circuit like that of FIG. 5 modified according to the present invention to cancel noise.
Figure 10:
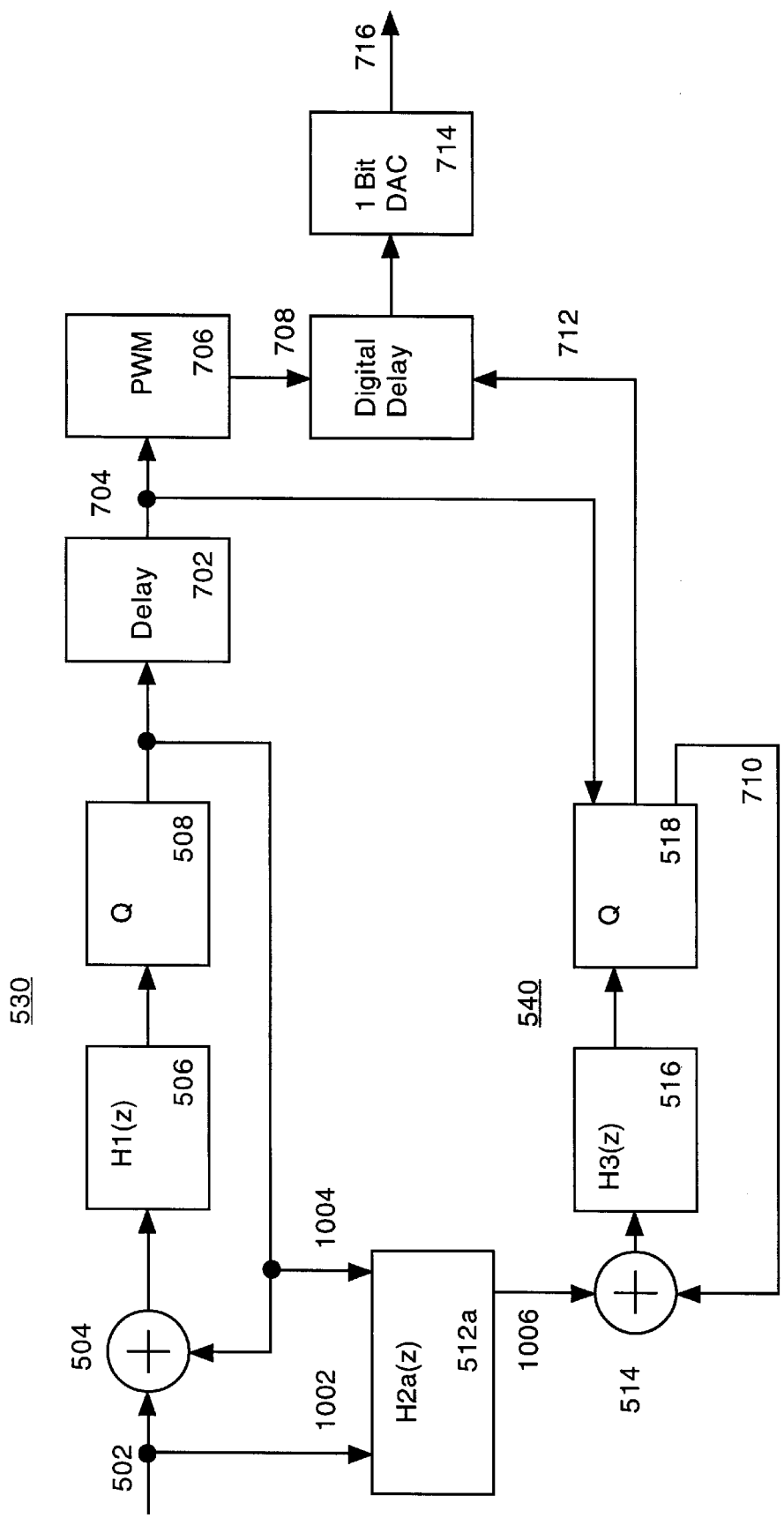
FIG. 10 is a block diagram showing a third embodiment of a MASH circuit like that of FIG. 5 modified according to the present invention to cancel noise.
Figure 11:
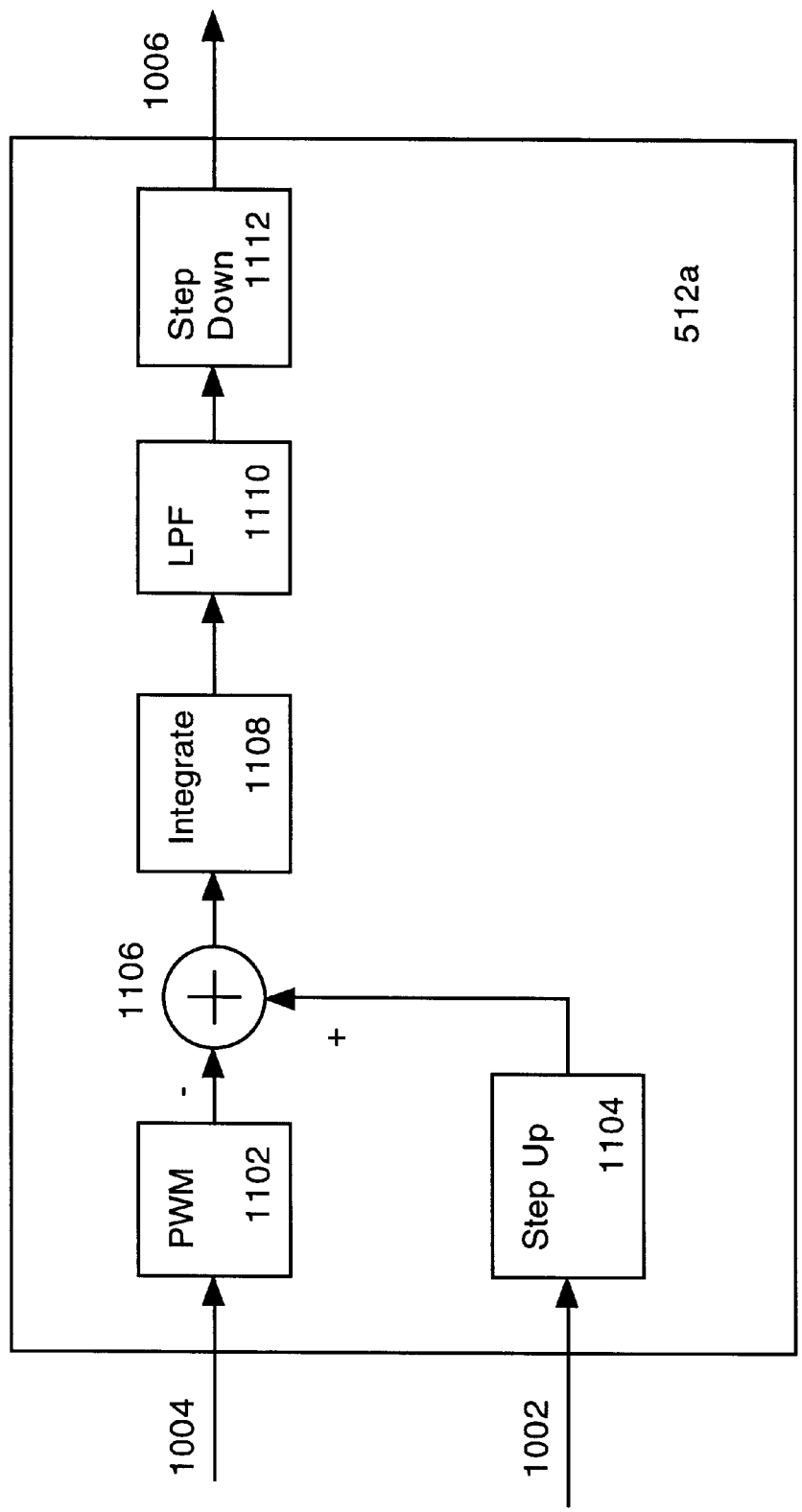
FIG. 11 is a block diagram showing an embodiment of the connecting filter block between the delta sigma stages of the MASH of FIG. 10.
Figure 12:
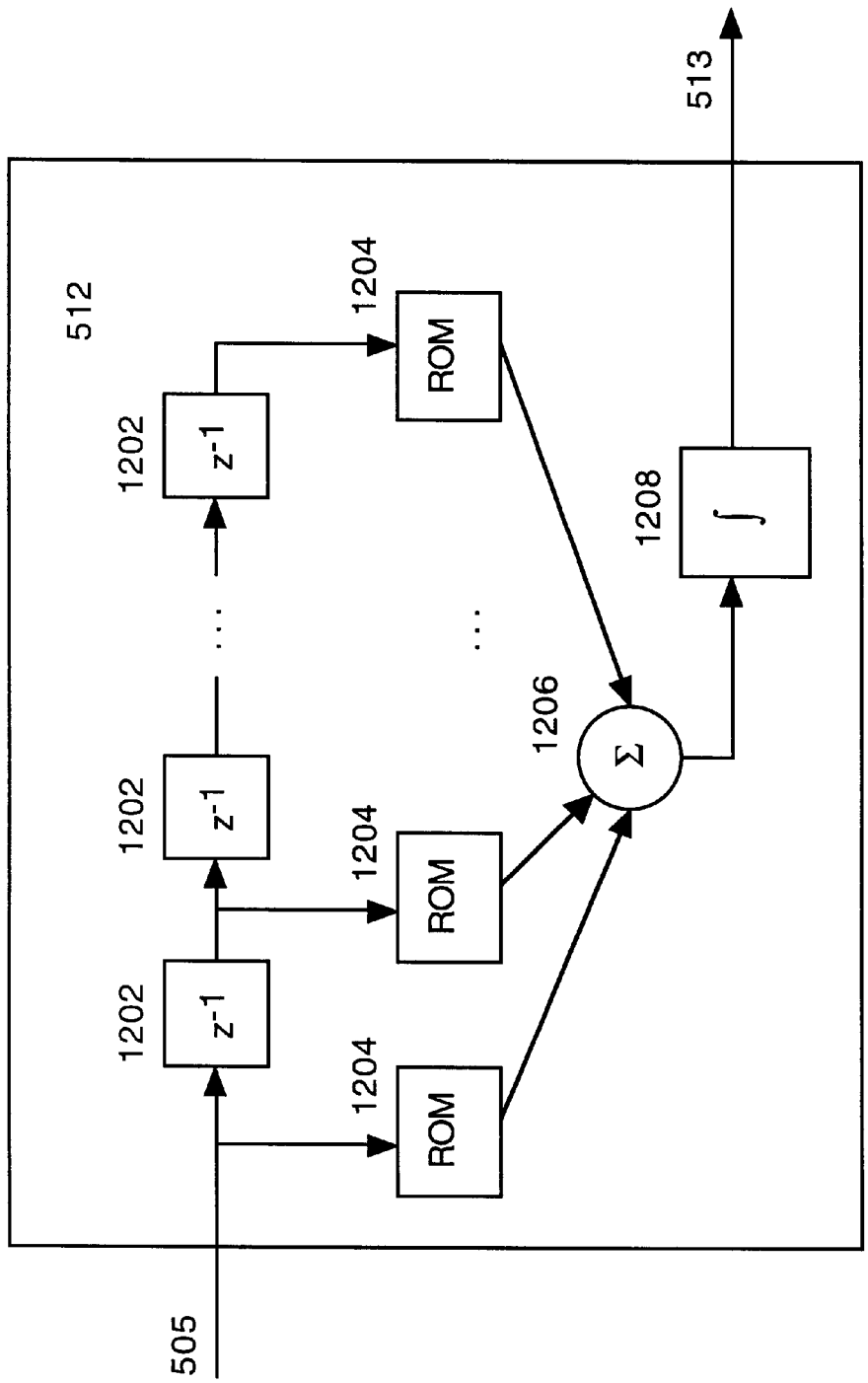
FIG. 12 is a block diagram showing an embodiment of the connecting filter block between the delta sigma stages of the MASH of FIG. 7.

The delta sigma converters of the MASH may be as shown in FIGS. 7, 9, and 10, or may be higher order converters as shown in FIG. 2, with one or more feedback paths optionally corrected. Embodiments of the connecting filter block 512, 512a of FIGS. 7, 9, and 10 are shown in FIGS. 11 and 12.

Figure 5:
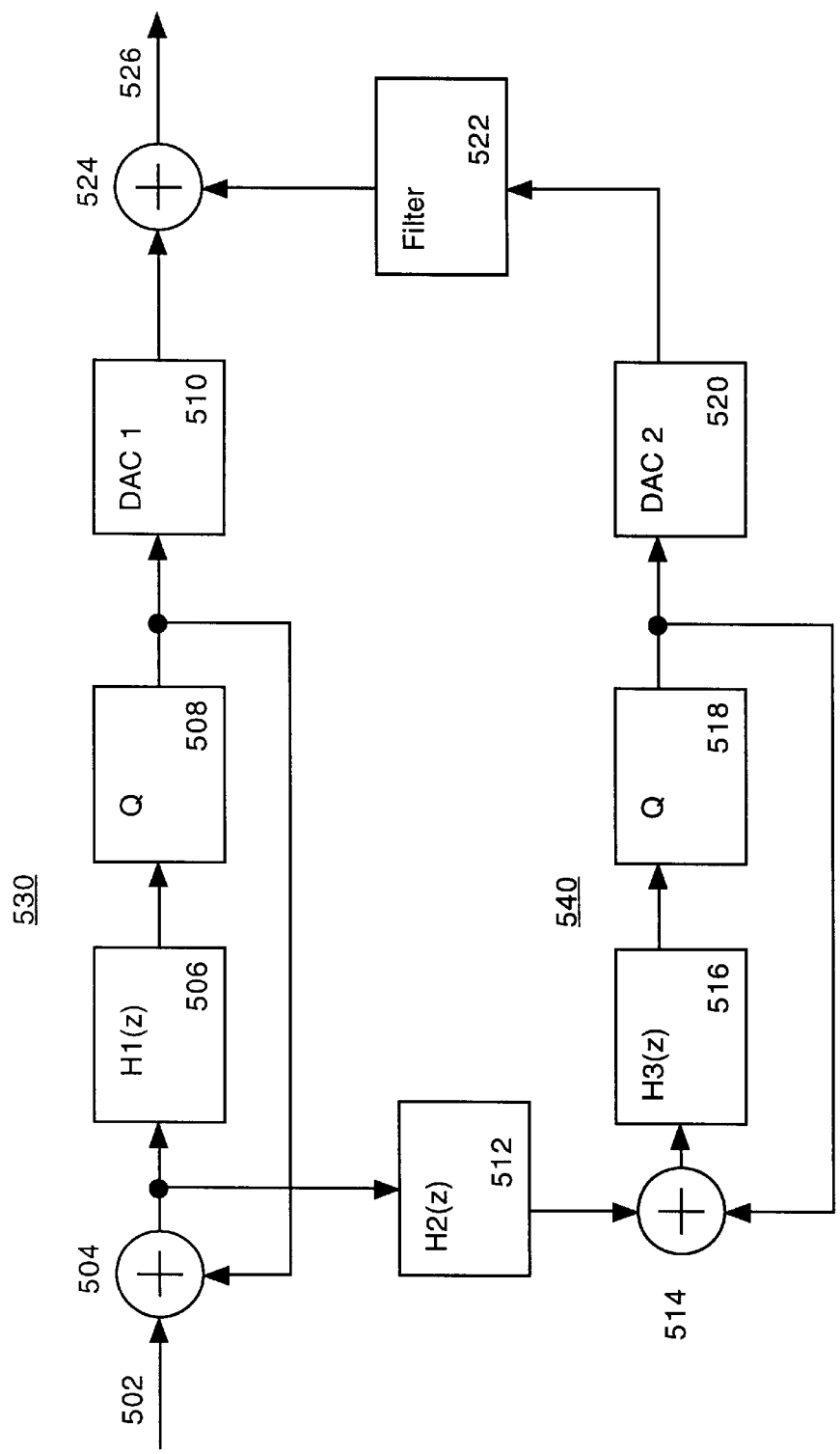
FIG. 5 (prior art) is a block diagram showing a conventional MASH delta sigma converter.

FIG. 5 (prior art) is a block diagram showing a conventional MASH delta sigma converter 500. MASH 500 comprises two delta sigma converters 530, 540 with converter 530 feeding into converter 540 via connecting filter 512. The output of each converter 530, 540 is converted to analog signals via DACs 510, 520 and combined by adder 524 to form output 526 (the output of DAC 520 is filtered by filter 522 prior to this operation). The duality of the integration and the differentiation creates a system that generates an inverse error signal that cancels much of the noise of the original converter 530.

Converter 530 has as its input signal 502, which is combined with the feedback of the converter by adder 504 in the conventional manner. Block 506 is the accumulator of converter 530, and block 508 performs the quantization.

The input to converter 540 is the error of converter 530, fed through block 512. Block 512 comprises a filter which generally performs some kind of integration, often related to the implementation of block 506. the output of block 512 is combined with the feedback of converter 540 by adder 514.

Block 516 is the accumulator of converter 540, and block 518 performs the quantization.

Note that if the circuitry of FIG. 5 is combined with an output PWM, the nonlinear effects of the PWM stage add significant distortion. This combination cannot achieve the noise and distortion specifications required for a high quality audio amplifier.

Figure 6:
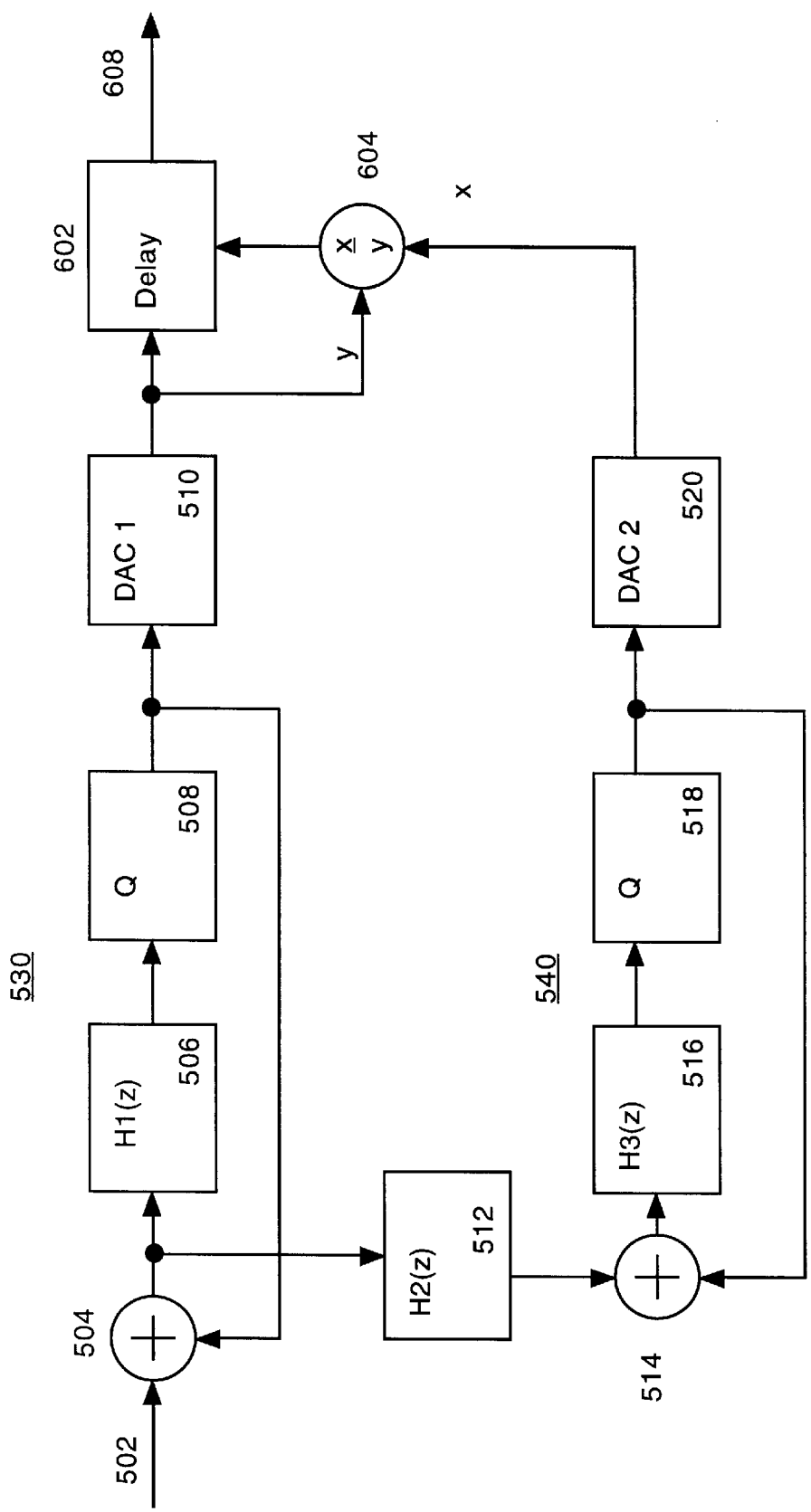
FIG. 6 is a block diagram conceptually showing the conventional MASH circuitry of FIG. 5 modified according to the present invention to cancel noise.

FIG. 6 is a block diagram conceptually showing the conventional MASH circuitry 500 of FIG. 5 modified according to the present invention to cancel noise. FIG. 6 is conceptual, because it would not be practical to build this system, and it does not include all of the features of the present invention. However, it illustrates the concept of canceling noise in digital to analog converters using level and timing control signals generated by delta sigma modulators. The present invention not only minimizes the bad effects of time shifts in the PWM output data, but in fact takes advantage of the time shifts to reduce distortion and noise.

Note that varying the timing of a signal with a control signal is the same as a differentiation of that control signal, superimposed on the signal being delayed. The gain of the differentiation is equal to the value of the signal being delayed, and this gain must be accounted for. Division circuit 604 accounts for the gain. The output of delay block 602 is output signal 608.

FIG. 7 is a block diagram showing a first embodiment of a MASH circuit like that of FIG. 5 modified according to the present invention to cancel noise. Quantizer 508 feeds PWM modulator 706. The error signal 505 is fed to cascaded converter 540 via filter 512, as signal 513. Delay output 712 of Constrained Quantizer 518 digitally controls the delay imposed by delay element 708. 708 may be implemented with D type flip flops and multiplexors. Delay element 702 is optionally used to compensate for possible delays caused by filter 512 or other processing tasks.

Figure 8:
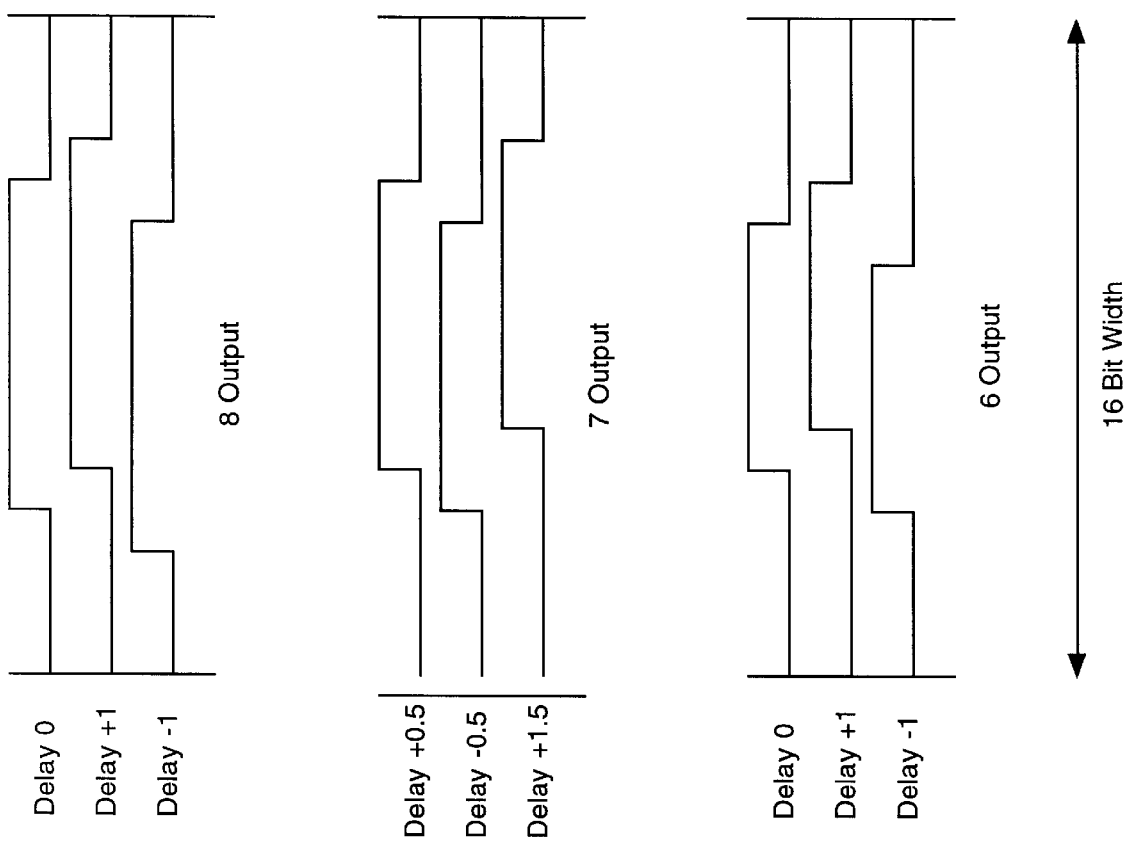
FIG. 8 is a timing diagram showing the inevitable non symmetry of odd duration data values.

To understand the operation of Constrained Quantizer 518, we must look at the effects of time shifting the output of PWM 706. Assume that PWM 706 is oversampling by a factor of 16. As shown in FIG. 8, when the pulse width is even, only integer values of delay can be chosen. When the width is odd, only half integer values can be chosen. In addition, the size of the available quantization steps varies with the pulse width. Constrained Quantizer 518 produces two outputs, delay factor 712 and feedback 710. The table below shows examples of possible outcomes for widths of 6, 7, and 8. Note that the quantizer chooses the value in the feedback column that comes the closest to its input, for the current value of the pulse width. The matching delay and feedback are than applied.

| Width (704) | Delay (712) | Feedback (710) |
|---|---|---|
| 6 | −1 | −6 |
| 6 | 0 | 0 |
| 6 | +1 | 6 |
| 7 | −0.5 | −3.5 |
| 7 | +0.5 | 3.5 |
| 7 | +1.5 | 10.5 |
| 8 | −1 | −8 |
| 8 | 0 | 0 |
| 8 | +1 | 8 |

The function can be implemented as:

Delay=floor(x/w+0.5),w even

Delay=floor(x/w)+0.5,w odd

Feedback=Delay * w

Where x is the quantizer input, and w is the pulse width, and the floor function is the same as truncating.

Preferably, the quantizer logic will only allow delays to be chosen that are realizable. In the case of a 15 wide pulse, only delays of +−0.5 could be realized.

All of the description here applies to a system with a two level output. This implementation would be appropriate for a class D audio amplifier. Other codings will work as well, such as a 3 level output for Class D, or a many bit output for general purpose conversion. All of these applications can benefit from this technique. The key point is using the time variation to reduce noise created by the level selection.

FIG. 9 is a block diagram showing a second embodiment of a MASH circuit like that of FIG. 5 modified according to the present invention to cancel noise. The circuit of FIG. 9 is very similar to the circuit of FIG. 7, except that the output stage is implemented as a lookup table stored in ROM 802 and fed to a parallel to serial converter 804. One versed in the art can find many other possible implementations of this output stage logic.

FIG. 10 is a block diagram showing a third embodiment of a MASH circuit like that of FIG. 5 modified according to the present invention to cancel noise. Filter 512a has been modified to utilize input signal 1002 (from signal 502) and feedback signal 1004, rather than having the error signal as its input. FIG. 11 is a block diagram showing an embodiment filter 512a. It is advantageous, when very low noise levels are required, to step up the input signal frequency. Thus, signal 1002 (the input signal 502 to the MASH) is stepped up by some desired factor. PWM 706 converts signal 1004 (the feedback in converter 530) to the same stepped up bit rate. Then adder 1106 subtracts the output of PWM 1102 from the output of step up circuit 1104. Integrator 1108 integrates the result. Low pass filter 1110 filters the output of the integrator, and step down circuitry 1112 decimates the signal back down to its normal frequency. Low pass filter 1110 is generally a low pass FIR filter such as is common in the area of multi-rate signal processing.

FIG. 12 is a block diagram showing an embodiment of the connecting filter block 512 between the delta sigma stages 530, 540 of the MASH of FIG. 7. The embodiment of filter 512 shown in FIG. 12 has some of the advantages of filter 512a of FIG. 11, without requiring the signal frequency to be stepped up. Since the patterns of the PWM 706 output are known, it is possible to achieve the effect of operating at the stepped up frequency by utilizing nonlinear functions in filter 512. input 505 is fed through a series of delays 1202. The input and output of each delay is fed into a ROM lookup 1204 operating at the standard signal frequency. The outputs of all of the ROMs 1204 are combined by adder 1206 and the result is passed through integrator 1208.

While the exemplary preferred embodiments of the present invention are described herein with particularity, those skilled in the art will appreciate various changes, additions, and applications other than those specifically mentioned, which are within the spirit of this invention.

What is claimed is:

1. A multiple stage delta sigma converter having an input and producing an output in response to the input, comprising:

a first delta sigma modulator having a quantizer providing a first modulator feedback signal and a first modulator output based on the input to the converter;

a second delta sigma modulator having a quantizer providing a second modulator feedback signal and a second modulator output based on the input to the converter; and means for generating the converter output wherein the level of the converter output is dependent upon the first modulator output and the timing of the converter output is dependent upon the second modulator output.

2. The delta sigma converter of claim 1, wherein the second modulator output is further based upon the first modulator feedback signal.

3. The converter of claim 2, wherein an output of the second modulator quantizer is constrained by an output of the first converter quantizer.

4. The converter of claim 3, wherein the second modulator quantizer output and the second modulator quantizer feedback signal are constrained by an output of the first converter quantizer.

5. The converter of claim 2, wherein the means for generating the converter output is a pulse wave modulator (PWM), and wherein the first modulator output controls the width of the PWM output signal and the second modulator output controls the delay of the PWM output signal.

6. The converter of claim 5, further including a 1 bit digital to analog converter connected to the output of the PWM for converting the PWM output signal to an analog signal.

7. The converter of claim 2, further including a delay element between the first modulator and the converter output generating means.

8. The converter of claim 7, wherein an output of the second modulator quantizer is constrained by an output of the delay element.

9. The converter of claim 8, wherein the second modulator output and the second modulator feedback signal are constrained by an output of the delay element.

10. The converter of claim 1, wherein the means for generating the converter output is a pulse wave modulator (PWM), and wherein the first modulator output controls the width of the PWM output signal and the second modulator output controls the delay of the PWM output signal.

11. The converter of claim 10, wherein the PWM comprises a lookup table.

12. The converter of claim 11, further including a connecting filter between the first modulator and the second modulator, having as inputs the converter input signal and the first modulator feedback signal, and providing as its output the second modulator input signal.

13. The converter of claim 12, wherein the connecting filter comprises:

a PWM for converting the format of the first modulator feedback signal;

step up means for stepping up the frequency of the converter input signal;

an adder for combining the output of the PWM and the step up means;

an integrator for integrating the output of the adder;

a low pass filter for filtering the output of the integrator; and step down means for stepping down the frequency of the output of the low pass filter to form the second modulator input signal.

14. The converter of claim 1, further including a connecting filter between the first converter and the second converter, having as its input the first converter feedback signal subtracted from the modulator input signal, and providing as its output the second converter input signal.

15. The converter of claim 14, wherein the connecting filter comprises:
   a plurality of delays;
   a plurality of lookup tables, each connected to an input or an output of a lookup table;
   an adder for combining the outputs of the lookup tables; and
   an integrator for integrating the output of the adder to form the second converter input signal.

16. A multiple stage delta sigma converter comprising:
   a first delta sigma modulator having a quantizer providing a first modulator feedback signal and a first modulator output based on an input to the converter;
   a second delta sigma modulator having a quantizer providing a second modulator feedback signal and a second modulator output based on an input to the converter; and
   a pulse wave modulator (PWM) for producing an output signal having width responsive to the first modulator output and delay responsive to the second modulator output.

17. The modulator of claim 16, wherein the output of the second modulator is further responsive to the first modulator feedback signal.

18. The modulator of claim 16, further including a 1 bit digital to analog converter connected to the output of the PWM for converting the PWM output signal to an analog signal.

19. A method for converting a digital signal to an formatted signal comprising:
   generating a first delta sigma output signal using a delta sigma modulator, based on the digital signal;
   generating a second delta sigma output signal using a delta sigma modulator, based on the digital signal; and
   generating a formatted signal having levels responsive to the first delta sigma output and timing responsive to the second delta sigma output.

20. The method of claim 19, wherein the step of generating a second delta sigma output signal is further dependent upon a feedback signal within the first delta sigma modulator.

21. The method of claim 19, further including the step of converting the formatted signal into an analog signal.

* * * * *